United States Patent
Salle et al.

(10) Patent No.: US 8,930,885 B2
(45) Date of Patent: Jan. 6, 2015

(54) RECONFIGURING A MODEL

(75) Inventors: Mathias Salle, San Francisco, CA (US);
Erik L. Eidt, Campbell, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 909 days.

(21) Appl. No.: 13/123,657

(22) PCT Filed: Oct. 30, 2008

(86) PCT No.: PCT/US2008/081760
§ 371 (c)(1),
(2), (4) Date: Apr. 11, 2011

(87) PCT Pub. No.: WO2010/050951
PCT Pub. Date: May 6, 2010

(65) Prior Publication Data
US 2011/0196659 A1    Aug. 11, 2011

(51) Int. Cl.
*G06F 9/44* (2006.01)
*G06F 17/50* (2006.01)
*G06Q 10/06* (2012.01)

(52) U.S. Cl.
CPC ............ *G06F 17/50* (2013.01); *G06Q 10/06* (2013.01)
USPC ............ 717/104; 717/107; 717/108; 717/111

(58) Field of Classification Search
None
See application file for complete search history.

(56) References Cited

U.S. PATENT DOCUMENTS

| 8,392,877 B1* | 3/2013 | Chiluvuri | 717/107 |
| 2006/0161884 A1 | 7/2006 | Lubrecht et al. | |
| 2007/0061191 A1 | 3/2007 | Mehrotra et al. | |
| 2008/0126163 A1 | 5/2008 | Hogan et al. | |

FOREIGN PATENT DOCUMENTS

| CN | 1429362 A | 7/2003 |
| CN | 101286240 A | 10/2008 |

OTHER PUBLICATIONS

The International Search Report and the Written Opinion of the International Searching Authority for International Application No. PCT/US2008/081760 dated Jul. 27, 2009, pp. 11.

* cited by examiner

*Primary Examiner* — Chuck Kendall
(74) *Attorney, Agent, or Firm* — Wagner Blecher, LLP; John P. Wagner, Jr.

(57) ABSTRACT

Reconfiguring a model [600] is described. An instruction is accessed [605], wherein the instruction comprises utilizing one or more model elements to reconfigure a model. A refinement chain is utilized [610] to access a portion of the model, the portion being non-variable and associated with the instruction, and wherein the refinement chain tracks design changes for the model. A specific instance is located [615], the specific instance being closest to the portion within the refinement chain at which an inclusion of the one or more model elements alters a performance of the model to reflect the inclusion. The model is re-instantiated [620] utilizing the one or more model elements beginning at the specific instance, thereby enabling a reconfiguration of the model according to the instruction.

15 Claims, 12 Drawing Sheets

| | | |
|---|---|---|
| 302 | ACTIVATION SERVICE | THE ACTIVATION SERVICE IS A GENERIC ACTUATOR WHICH RESPONSIBILITY IS TO DISPATCH SERVICE ACTIVATION REQUESTS TO THE APPROPRIATE CUSTOM ACTIVATOR. |
| 304 | APPROVAL SERVICE | THE APPROVAL SERVICE (COMPUTATIONAL SERVICE) IS RESPONSIBLE FOR APPROVING OR NOT A RECEIVED ORDER. |
| 306 | AUTHENTICATION SERVICE | THE AUTHENTICATION SERVICE (DATA AND COMPUTATIONAL SERVICE) IS RESPONSIBLE FOR THE MANAGEMENT OF USERS, ROLES AND ACCESS RIGHT AS WELL AS FOR GRANTING AUTHORIZATIONS. |
| 308 | BILLING SERVICE | THE BILLING SERVICE (COMPUTATIONAL SERVICE) IS RESPONSIBLE FOR SETTING UP CHARGE BACK MECHANISM AND PROPER BILLING FOR RECEIVED ORDERS. |
| 312 | CATALOG SERVICE | THE CATALOG SERVICE (COMPUTATIONAL SERVICE) IS RESPONSIBLE FOR THE GENERATION OF A SERVICE OFFERINGS. |
| 314 | CONFIGURATION MANAGEMENT SERVICE | THE CONFIGURATION MANAGEMENT SERVICE (DATA SERVICE) IS RESPONSIBLE FOR CARRYING OUT THE BINDING PHASE OF THE INSTANTIATION PROCESS AND FOR THE MANAGEMENT OF THE LIFECYCLE OF INSTANCES. |
| 316 | CREATION CONFIGURATION SERVICE | THE CREATION CONFIGURATION SERVICE (DATA SERVICE) IS RESPONSIBLE FOR CARRYING OUT THE GROUNDING PHASE OF THE INSTANTIATION PROCESS. |
| 318 | DESIGN SERVICE | THE DESIGN SERVICE (DATA SERVICE) IS RESPONSIBLE FOR THE MANAGEMENT OF THE LIFECYCLE OF MODELS. |

FIG. 3A

| | | |
|---|---|---|
| 322 | DISCOVERY SERVICE | THE DISCOVERY SERVICE (COMPUTATIONAL SERVICE) IS A GENERIC ACTUATOR RESPONSIBLE FOR TRIGGERING THE DISCOVERY OF ASSETS IN THE INFRASTRUCTURE TO FULFILL ITS RESPONSIBILITY, ITS CONNECTS TO CUSTOM DISCOVERY SERVICES. |
| 324 | INCIDENT SERVICE | THE INCIDENT SERVICE (DATA SERVICE) IS RESPONSIBLE FOR THE MANAGEMENT OF THE LIFECYCLE OF INCIDENTS. |
| 326 | INSTALLER SERVICE | THE INSTALLER SERVICE IS A GENERIC ACTUATOR WHICH RESPONSIBILITY IS TO DISPATCH SERVICE INSTALLATION REQUESTS TO THE APPROPRIATE CUSTOM ACTIVATOR. |
| 328 | LOGGING SERVICE | THE LOGGING SERVICE (DATA SERVICE) IS RESPONSIBLE FOR THE LIFECYCLE MANAGEMENT OF LOG MESSAGES. |
| 332 | MONITORING SERVICE | THE MONITORING SERVICE IS A GENERIC ACTUATOR WHICH RESPONSIBILITY IS TO DISPATCH SERVICE MONITORING REQUESTS TO THE APPROPRIATE CUSTOM ACTIVATOR. |
| 334 | OFFERING AVAILABILITY ESTIMATION SERVICE | THE OFFERING AVAILABILITY ESTIMATION SERVICE (COMPUTATIONAL SERVICE) IS RESPONSIBLE FOR THE GENERATION OF SERVICE OFFERING AVAILABILITY AND PRICING. |
| 336 | ORDER PROCESSING SERVICE | THE ORDER PROCESSING SERVICE (DATA SERVICE) IS RESPONSIBLE FOR THE MANAGEMENT OF THE LIFECYCLE OF ORDERS. |

FIG. 3B

| | | |
|---|---|---|
| 338 | PACKAGE MODEL DESIGN SERVICE | THE PACKAGE MODEL DESIGN SERVICE (DATA SERVICE) IS RESPONSIBLE FOR THE LIFECYCLE MANAGEMENT OF PACKAGE MODEL. |
| 342 | POLICY SERVICE | THE POLICY SERVICE (DATA AND COMPUTATIONAL SERVICE) IS A GENERIC SERVICE AND HAS RESPONSIBILITY OF DISPATCHING POLICY EVALUATION REQUESTS TO THE APPROPRIATE SPECIFIC POLICY SERVICES. |
| 344 | REQUEST RESOLUTION SERVICE | THE REQUEST RESOLUTION SERVICE (COMPUTATIONAL SERVICE) IS RESPONSIBLE FOR THE INITIATING THE INSTANTIATION PROCESS OF MODELS. |
| 346 | RFC EXECUTION SERVICE | THE REQUEST FOR CHANGE (RFC) EXECUTION SERVICE (DATA SERVICE) IS RESPONSIBLE FOR THE MANAGEMENT OF THE LIFECYCLE OF RFCS IN THE PLATFORM. |
| 348 | RFC SCHEDULING SERVICE | THE REQUEST FOR CHANGE (RFC) SCHEDULING SERVICE (COMPUTATIONAL SERVICE) IS RESPONSIBLE FOR THE FINDING OPTIMAL SCHEDULES FOR RFC IN THE PLATFORM. |
| 352 | SESSION SERVICE | THE SESSION SERVICE (DATA SERVICE) IS RESPONSIBLE FOR THE MANAGEMENT OF THE LIFECYCLE OF SESSIONS. THE CREATE METHOD GENERATE A NEW SESSION IN THE OPEN STATE ASSOCIATED WITH A NEW, UNIQUE SESSIONKEY, CHANGES TO THE SESSION STATE, SUCH AS CLOSING THE SESSION, IS DONE THROUGH THE UPDATE METHOD. |
| 354 | VALIDATION SERVICE | THE VALIDATION SERVICE (COMPUTATIONAL SERVICE) IS RESPONSIBLE FOR THE VALIDATION OF THE WELL FORMNESS OF AN ORDER. |
| 356 | CHANGE CATALOG SERVICE | THE CHANGE CATALOG SERVICE IS RESPONSIBLE FOR THE MANAGEMENT OF CHANGES TO THE CATALOG. |
| 358 | CONSUMER MANAGEMENT SERVICE | THE CONSUMER MANAGEMENT SERVICE IS RESPONSIBLE FOR PROVIDING AN INTERFACE FOR CONSUMERS AND MANAGES RETRIEVING SERVICE OFFERINGS, ORDERING SERVICES, RETRIEVING CHANGES, ORDER CHANGES, AND LOGINS. |
| 360 | PROVIDER MANAGEMENT SERVICE | THE PROVIDER MANAGEMENT SERVICE IS RESPONSIBLE FOR PROVIDING AN INTERFACE FOR PROVIDERS AND MANAGES USERS, DESIGNS, AND PRICING. |

Start

↓

Access an instruction, wherein the instruction comprises utilizing one or more model elements to reconfigure a model.
605

↓

Utilize a refinement chain to access a portion of the model, the portion being non-variable and associated with the instruction, and wherein the refinement chain tracks design changes for the model.
610

↓

Locate a specific instance closest to the portion within the refinement chain at which an inclusion of the one or more model elements alters a performance of the model to reflect the inclusion.
615

↓

Re-instantiate the model utilizing the one or more model elements beginning at the specific instance, thereby enabling a reconfiguration of the model according to the instruction.
620

↓

End

Start

Access a non-variable portion of a model that is a target of an instruction, the instruction comprising altering the model utilizing one or more model elements.
805

Access a refinement chain associated with the model, the refinement chain tracking design changes for the model.
810

Compare the refinement chain to the instruction and locating a specific instance of the model at which an inclusion of the one or more model elements alters a performance of the model to reflect the inclusion.
815

Based on the comparing and the locating, generating a re-instantiated model to correlate with the instruction.
820

End

FIG. 8

RECONFIGURING A MODEL

FIELD

Embodiments of the present invention relate in general to the field of managing models.

BACKGROUND

Over the last few years, information technology (IT) organizations have increasingly adopted standards and best practices to ensure efficient IT service delivery. In this context, the IT Infrastructure Library (ITIL) has been rapidly adopted as the de facto standard. ITIL defines a set of standard processes for the management of IT service delivery organized in processes for Service Delivery (Service Level Management, Capacity Management, Availability Management, IT Continuity Management and Financial Management) and Service Support (Release Management, Configuration Management, Incident Management, Problem Management and Change Management). The service support processes, such as Configuration Management, Incident Management, and Configuration Management are some of the more common processes IT organizations have implemented to bring their service to an acceptable level for their businesses.

The implementation of ITIL processes has yielded significant results to IT organizations by defining interfaces between service providers and consumers; by clarifying the IT organizational structures, roles, and responsibilities; and by designing internal processes for the management of IT operations. IT Service Management (ITSM) is a process-based practice intended to align the delivery of IT services with the needs of the enterprise, while emphasizing benefits to customers. ITSM focuses on delivering and supporting IT services that are appropriate to the business requirements of the organization, and it achieves this by leveraging ITIL-based best practices that promote business effectiveness and efficiency. Thus, the focus of ITSM is on defining and implementing business processes and interactions there between to achieve desired results. IT services are typically built around the processes. For example, in a manufacturing application, the ITSM may provide services built around a build-to-order manufacturing process scenario. The ITSM architecture generally provides services that are capable of being directly instantiated. With a focus on processes, presenting and packaging an organization's IT needs may be a challenge in an ITSM environment.

BRIEF DESCRIPTION OF THE DRAWINGS

FIGS. 3A, 3B, and 3C illustrate in a tabular form an example list of service operations supported by an example architecture described with reference to FIGS. 2A and 2B, according to an embodiment.

FIG. 6 is a flow chart of an example method for reconfiguring a model, according to an embodiment.

FIG. 8 is a flow chart of an example method for reconfiguring a model, according to an embodiment.

Figure 1A:
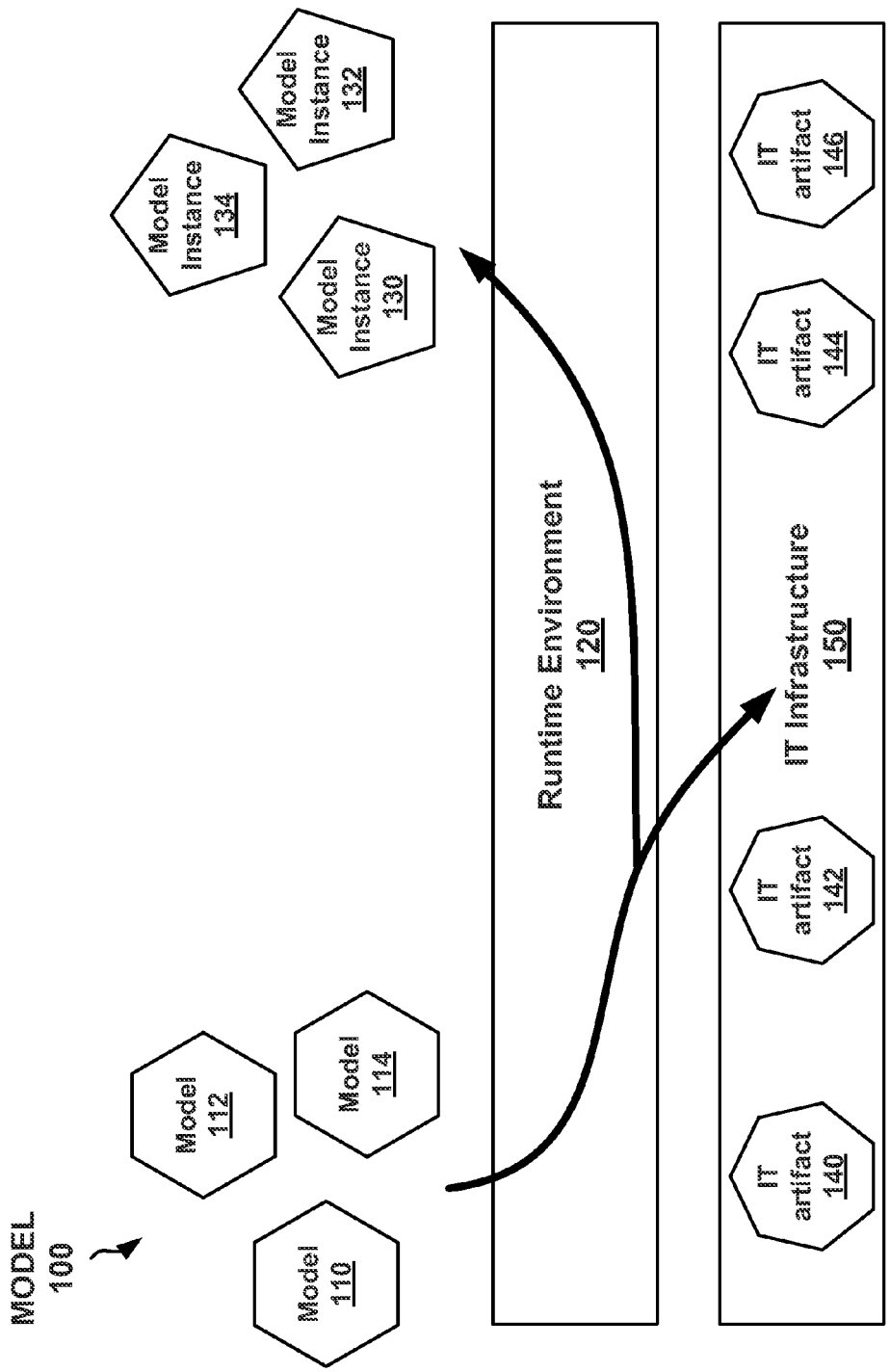
FIG. 1A illustrates an example structure of a model for IT services, according to an embodiment.

The drawings referred to in this description of embodiments should not be understood as being drawn to scale unless specifically noted.

DESCRIPTION OF EMBODIMENTS

Reference will now be made in detail to embodiments of the present technology, examples of which are illustrated in the accompanying drawings. While the present technology will be described in conjunction with various embodiment(s), it will be understood that they are not intended to limit the present technology to these embodiments. On the contrary, embodiments of the present technology are intended to cover alternatives, modifications and equivalents, which may be included within the spirit and scope of the various embodiments as defined by the appended claims.

Furthermore, in the following description of embodiments, numerous specific details are set forth in order to provide a thorough understanding of embodiments of the present invention. However, embodiments of the present technology may be practiced without these specific details. In other instances, well known methods, procedures, components, and circuits have not been described in detail as not to unnecessarily obscure aspects of the present embodiments.

Unless specifically stated otherwise as apparent from the following discussions, it is appreciated that throughout the present description of embodiments, discussions utilizing terms such as "accessing", "utilizing", "locating", "re-instantiating", "increasing", "substituting", "aggregating", "verifying", "comparing", or the like, refer to the actions and processes of a computer system, or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. Embodiments of the present technology are also well suited to the use of other computer systems such as, for example, optical and mechanical computers.

The functionality of various modules, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

The following terminology may be useful in understanding the description of embodiments. It is to be understood that the terminology described herein is for the purpose of description and should not be regarded as limiting.

Architecture—A blueprint or basic infrastructure designed to provide one or more functions. An architecture used in an IT environment may typically include hardware, software, and services building blocks that are designed to work with each other to deliver core functions and extensible functions. The core functions are typically a portion of the architecture, e.g., an operating system, which may not be modifiable by the user. The extensible functions are typically a portion of the architecture that has been explicitly designed to be customized and extended by the user as a part of the implementation process. For example, services oriented architecture (SOA) is a type of an architecture used for addressing the need for structuring IT services that lowers cost and enhances reusability.

Model—A model can be a representation of the characteristics and behavior of a system, element, solution, or service. A model as described herein captures the design of a particular IT system, element, solution, or service. The model can be a declarative specification of the structural, functional, non-functional, and runtime characteristics of the IT system, element, solution, or service. The instantiation of a model creates a model instance. Unlike object oriented (OO) theory, in which an instance object can be a slot space, the model instance can be a design space that may be capable of accommodating refinement.

IT artifact—An IT artifact refers to a tangible attribute or property of an IT system. Examples of an IT artifact may include hardware, software, documentation, source code, test apparatus, project plans, educational and marketing material, and similar others. The IT artifact may be available for external or internal use.

Separation of concerns—A technique for addressing different issues of a problem individually, thereby making it possible to concentrate on each issue separately. Applying this principle may result in a decrease in the complexity by dividing the problem into different smaller issues; support division of efforts and separation of responsibilities; and improve the modularity of IT systems or artifacts.

Service—Utility or benefit provided by a provider to a consumer. The provider and the consumer may vary by application and may include an enterprise, a business unit, a business process, an application, a third party, an individual, and similar others. Enterprise services may be provided in the course of conducting the enterprise business. IT services generally refer to any application that enables the enterprise to provide utility or benefit by adding functionality to the IT infrastructure.

Service Model—A service model can be the representation of a service within a SOA. It defines the externally visible description, behavior, state, and operations available from a service to other services. As described herein, instantiation of a service model can be conducted in two phases—a binding phase and a grounding phase. The binding phase can be responsible for resolving dependencies between models. The grounding phase can be responsible for materializing the instances, e.g., by creating an IT artifact corresponding to the specification defined in the specific instance.

Meta Model—A meta model (or metamodel) can be a description of a set of building blocks, constructs and rules that define the model itself.

System—One or more interdependent elements, components, modules, or devices that co-operate to perform one or more predefined functions.

Configuration—Describes a set up of elements, components, modules, devices, and/or a system, and refers to a process for setting, defining, or selecting hardware and/or software properties, parameters, or attributes associated with the elements, components, modules, devices, and/or the system.

It is appreciated that it would be desirable to provide a services architecture that would include tools and techniques to initially design, reuse, maintain, and refine services during their entire lifecycle, thereby ensuring alignment between IT services and IT infrastructure. That is, it would be desirable to provide IT service lifecycle management tools and techniques that would promote the development, capture, and subsequent reuse and refinement of reliable and scalable services. Of note, it is also desirable that the separation of concerns between the artifacts managed by the services be based on roles, e.g., a designer or developer and an end user of services. Therefore, a need exists to provide improved tools and techniques to be used in the automation of IT services lifecycle management.

Systems and methods disclosed herein provide an example architecture that is capable of designing and delivering IT services that are entered as a configure-to-order compared to a build-to-order provided by traditional ITSM services. An analogy may be made between a builder that is only capable of building standard model homes that are orderable as a build-to-order home and an architect that is capable of building a customized home in accordance with user specifications and that is orderable as a configure-to-order home. New features or functions of the configure-to-order home that were not included in the standard build-to-order home may be cataloged (with known price and delivery) and offered as re-usable features or functions that may be combined with existing model homes.

An Example Model for Information Technology (IT) Services

FIG. 1A illustrates an example structure of model 100, according to an embodiment. Model 100 captures the design of a particular IT element or solution, e.g., IT services captured as a service model. As described earlier, a service model can be the representation of a service within a SOA. It defines the externally visible description, behavior, state, and operations available from a service to other services. Model 100 includes one or more service models 110, 112 and 114 capable of being instantiated in runtime environment 120 to generate corresponding specific instance 130, 132 and 134 and corresponding IT artifacts 140, 142, 144 and 146 generated in IT infrastructure 150. Thus, the instantiation of a model results in a generation of a virtual runtime object, e.g., the specific instance, and also results in a generation of a real, tangible IT artifact in IT infrastructure 150. IT infrastructure 150 may be a data center that includes hardware, software, communications, applications, services, and similar other components to provide IT functions. Runtime environment 120 includes services that process service models 110, 112 and 114.

Model 100 can be a declarative specification of the structural, functional, non-functional, and runtime characteristics of an IT system. That is, model 100 may use declarative programs that may include expressions, relationships, or statements of truth. The declarative programs may not include variables. Closely equivalent to the concept of a class in Object Oriented (OO) theory, model 100 supports the principles of encapsulation and hiding of implementation detail. As in OO, model 100 also supports recursive composition. Also as in OO theory, in which a class instantiation results in an object, the instantiation of a service model results in the creation of a specific instance. However, unlike OO, in which an instance object is a slot space, the specific instance, e.g., each of specific instance 130, 132 and 134, can be a design space that can accommodate refinement.

In addition, as described earlier, a corresponding IT artifact becomes associated with the model. In the depicted embodiment, the bi-instantiation process for service models 110, 112 and 114 is desirable to not only create a virtual runtime object that represents that particular instance of the service model but in addition also generate an IT component or system in the real, tangible, IT Infrastructure 150. A relationship between a specific instance, e.g., one of the specific instances 130, 132 and 134, and an IT artifact, one of the IT artifacts 140, 142, 144 and 146, is therefore homomorphic. That is, one represents the other and a change in one is reflected in the other. Additional description of the two-phase instantiation process for a service model is described with reference to FIG. 1B.

Referring back to FIG. 1A, in order to support initial design, reuse, maintain, and refinement during the entire lifecycle of the service models, model 100 supports the following example properties (among others): refinement, variability, polymorphism, composability, import, association, constructors, operations, deployment, monitors, declarative modeling language, and best practice. Recursive composability enables a designer to depend on and leverage existing designs in order to define or create new ones, which in turn are available to others to reuse. Refinement allows the instantiation process to be multi-step, thereby allowing for a greater flexibility in the model design. Encapsulation (also referred to as information hiding), use of a clear boundary between the visibility into the internal design of a service model and its publicly available characteristics, supports inter-model dependencies that allow changes to the internal specification without requiring changes in the model user.

Characterization enables the expressing of the outward nature of the service model in terms that are directly relevant to the consumer of the service model instead of in terms relevant to the implementer. Variation enables capturing variations in a single service model. A service model may be defined under several variations of its characteristics to reflect specific changes to the underlining design. Capturing these variations in a single service model avoids combinatorial explosion of service models and supports better service model reuse. Declaration enables definition of service models using declarative specifications. The service models are defined in terms of their association to underlying design instead of as process steps for instantiation using programming code. The use of statements of truth to define the service models to reduce errors due to interpretation or to avoid the use of languages has meaning only during the execution in the intended environment.

The service models 110, 112 and 114 can be defined by a meta model, thereby enabling the service models 110, 112 and 114 to be translated into other modeling languages. Thus, model 100 enables easy translation of user-defined service models to other forms (both model-oriented and script-oriented forms) thereby enhancing its flexibility. In addition, model 100 provides the tools and techniques for the replacement of one modeling language with other modeling languages and for the coexistence of multiple structural modeling languages. As described herein, a meta model is a service model that further explains or describes a set of related service models. Specifically, the meta model includes an explicit description (of constructs and rules) of how a domain-specific service model is built.

Model 100 may be specified by using various modeling languages including, among others, a unified modeling language (UML), the Resource Description Framework (RDF), Extensible Markup Language (XML) Schema, XML Metadata Interchange (XMI), and Java languages or a combination thereof. The RDF may include extensions such as RDF schema and languages such as the RDF Ontology Web Language (RDF/OWL).

The concept of refinement, which may be an example of an extensible feature of model 100, allows a smooth multi-valued transition from a model to a model instance. Whereas classic modeling approaches [OO, CIM, SML, UML] are based on a single value slot mechanism for specific instance creation, refinement can be based on a linked list approach that enables multi-slot capabilities for service model elements. In addition, substitution can be supported, similar to XML schema. A refinable object or a refinable service model element is any object/element that extends a refinable construct. The refinable construct carries metadata including: 1) allowRefinement: a Boolean attribute that can be used to stop the refinement process, 2) timestamp: a timestamp that record the time at which the refinement occurred, and 3) tag: a tag that records extra information such as purpose of the refinement or similar other.

Figure 1B:
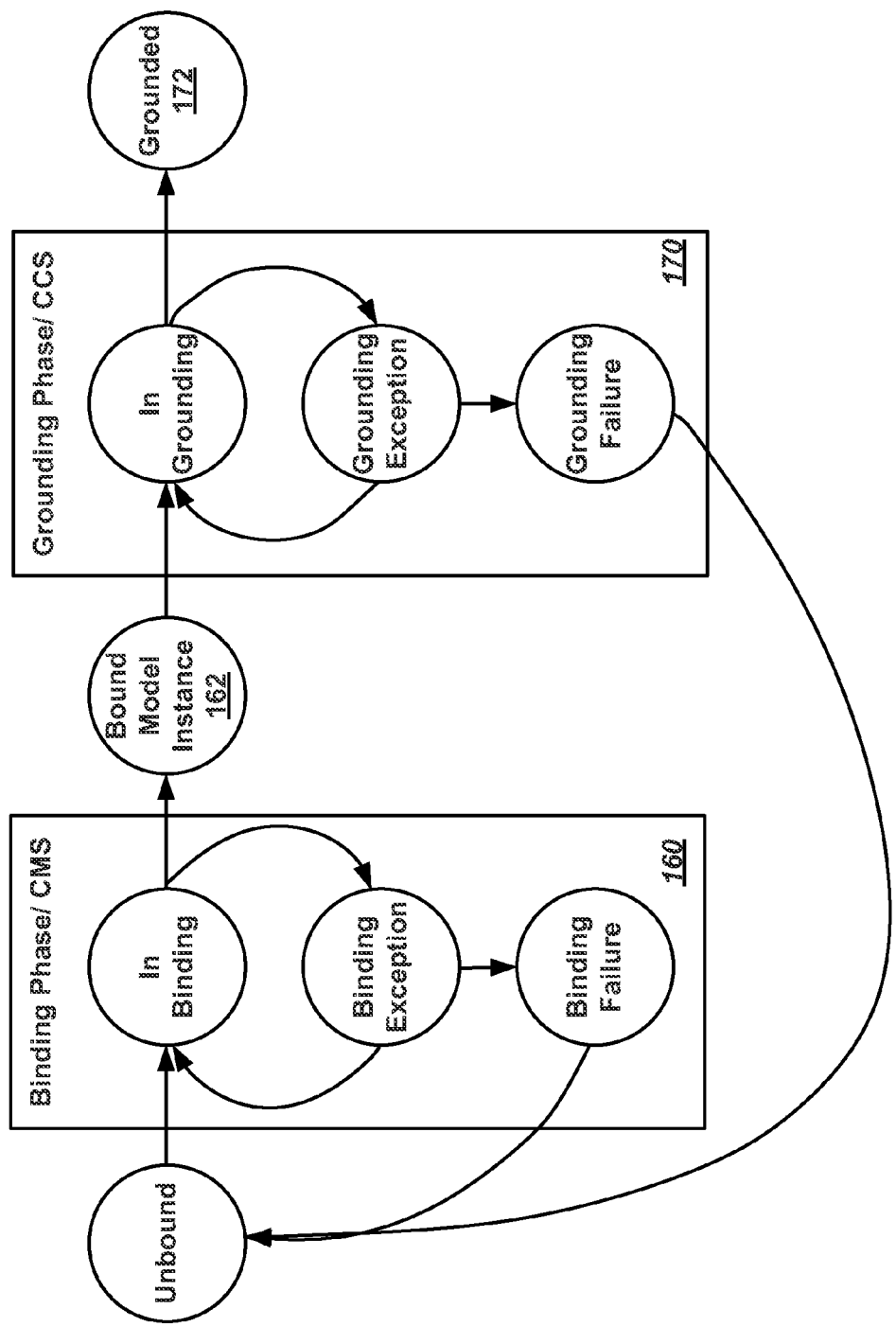
FIG. 1B describes a state transition diagram for an example two-phase model instantiation process, according to an embodiment.

FIG. 1B illustrates an example state transition diagram for a two-phase service model instantiation process, according to an embodiment. The instantiation of a service model, e.g., any one of the service models 110, 112 and 114, can be conducted in two phases: binding phase 160 and grounding phase 170. In an example non-depicted embodiment, binding phase 160 may be implemented in a binding phase engine and grounding phase 170 may be implemented in a grounding phase engine. In binding phase 160 inter-model dependencies, e.g., made by a service model to other service models, can be resolved. An output of binding phase 160 is bound model instance 162. Specific instances 130, 132, and 134 are examples of bound model instance 162. Binding phase 160 may be viewed to provide a dynamic linking between specific instances. Dependencies to other service models can be abstract, refined or very specific and binding phase 160 resolves these types of model references by reusing existing specific instances or creating new specific instances. The binding phase can be inherently recursive in that the binding of a dependent service model can itself trigger a binding of its dependencies.

In the grounding phase 170, the bound model instance 162 can be materialized to generate a bound and grounded model instance 172. The materializing includes creating an IT artifact corresponding to the specification defined in the model instances. This can be achieved by recursively traversing the instance tree and creating, when appropriate, the corresponding artifacts in the IT infrastructure. IT artifacts 140, 142, 144 and 146 are examples of a bound and grounded model instance 172.

An Example Architecture for a Runtime Environment

Figure 2A:
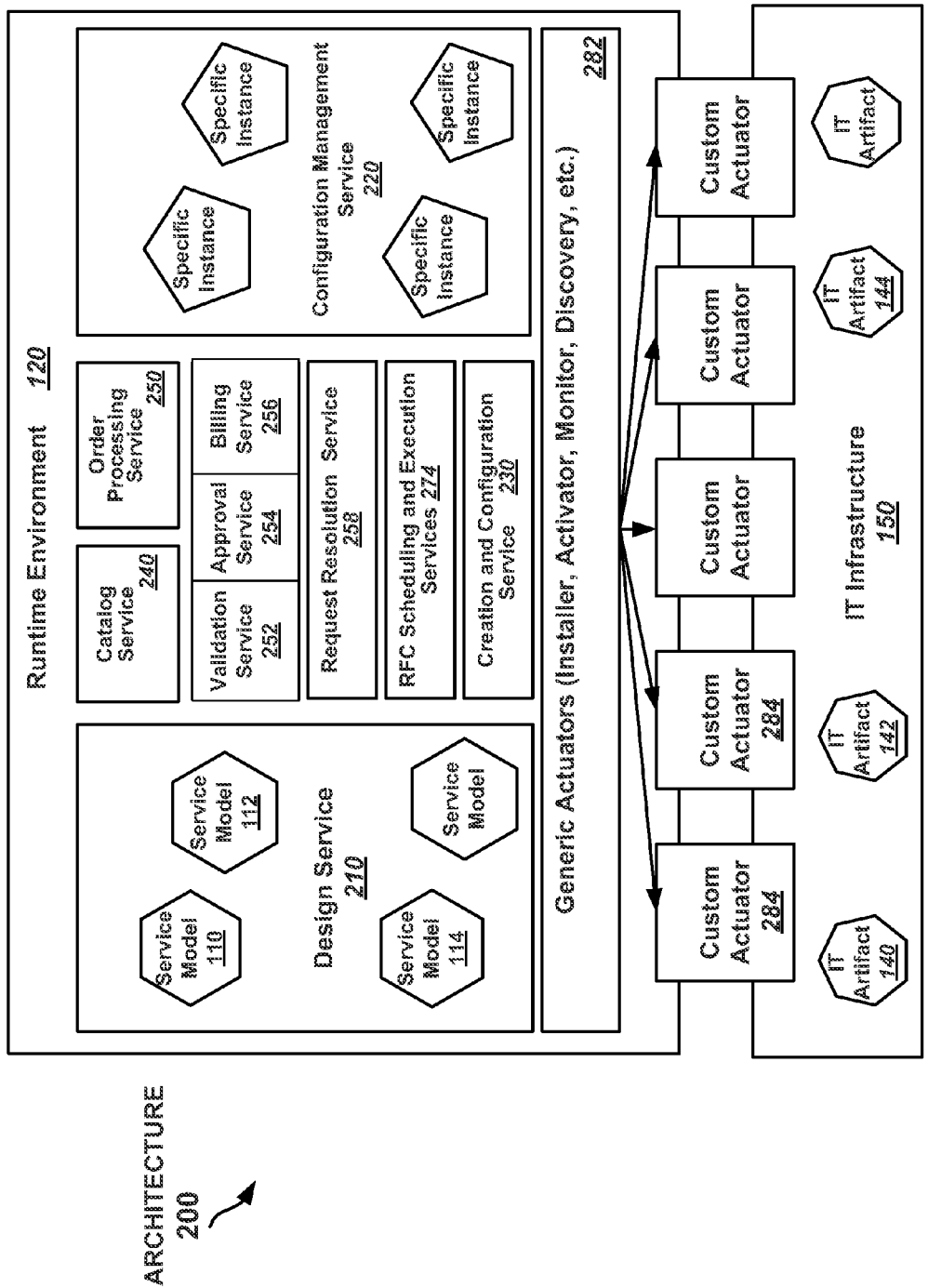
FIG. 2A illustrates an example architecture for a runtime environment described with reference to FIG. 1A, according to an embodiment.
Figure 2B:
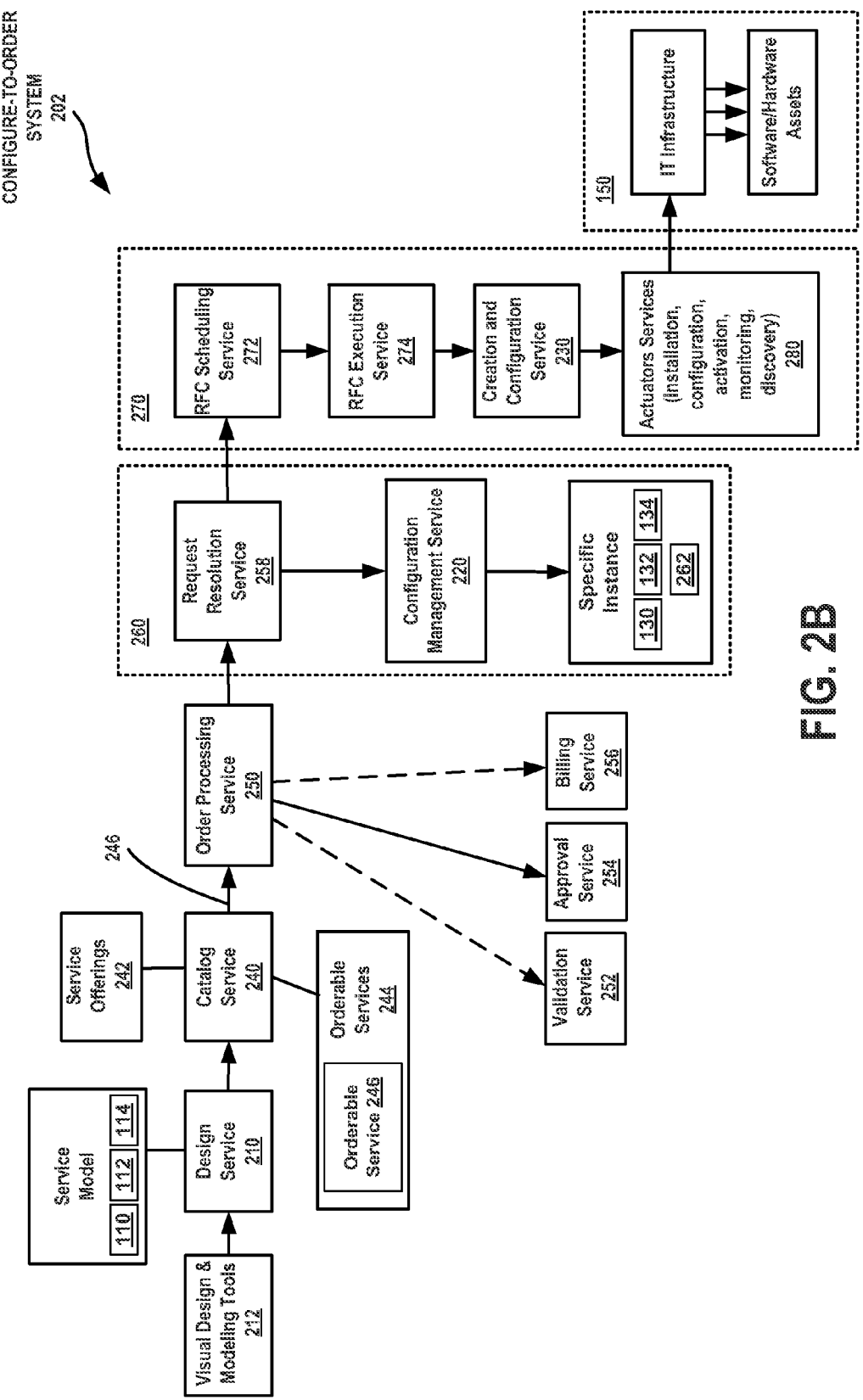
FIG. 2B illustrates a block diagram of an example configure-to-order system to implement an example architecture described with reference to FIG. 2A, according to an embodiment.

FIG. 2A illustrates an example architecture 200 for a runtime environment 120 described with reference to FIG. 1A, according to an embodiment. Architecture 200 can be deployed to provide e-commerce for IT services. That is, architecture 200 may be deployed as a configure-to-order business system in which a set of predefined models of IT systems are offered to customers (may include internal or external users, clients and similar others). FIG. 2B illustrates a block diagram of an example configure-to-order system 202 to implement an architecture 200 described with reference to FIG. 2A, according to an embodiment.

Referring to FIGS. 2A and 2B, the predefined models are for IT services. It is understood that the models may be expressed for other aspects of IT within an enterprise. Architecture 200 includes a design service 210 operable to generate models 110, 112 and 114. Design service 210 may include design tools 212 and techniques (such as declarative programming) available to a designer or an architect of IT services to manage the lifecycle of the models from initial design to cataloging to refinement. In a particular embodiment, design service 210 can be operable to capture declarative specifications of services as a service model.

Catalog service 240 can be operable to store plurality of service offerings 242. Plurality of service offerings 242 are models of services that are cataloged and are orderable by a customer. Catalog service 240 communicates with design service 210 to access one or more service models that are new and not been previously cataloged. The service models may include modifications or refinements made to existing models included in plurality of service offerings 242. The one or more service models generated by design service 210 are combined into plurality of service offerings 242 to provide a catalog of orderable services 244.

End users may access the features of configure-to-order system 202 through catalog service 240 and Order Processing Service (OPS) 250 to browse, search, select, configure, and order the type of service model to be created and ordered or the type of changes desired to an existing model. In order to simplify the user interface, catalog service 240 may filter model information provided to the user. That is, complex details about the model and its methods and properties, which may be provided to a designer or an architect, may be hidden from the user, thereby simplifying the user interface.

For example, complex details of a blade server model having several processors arranged as a cluster may be presented to the user as a normal, high, and non-stop availability selection. Included in the information provided to the user is price and delivery associated with the order. In a particular embodiment, at least one orderable service 246 can be selectable from the catalog of orderable services 244 for placing an order. The selection may be performed by one of a user and an application program. In a particular embodiment, OPS 250 can include a set of intermediate services for performing validation service 252, approval service 254 and billing service 256 of the end user order.

Order instantiation service 260 is coupled to receive the order (that has been validated and approved) for the at least one orderable service 246 from OPS 250. Specifically, upon validation and approval of the order by OPS 250, request resolution service 258 can be triggered to initiate further processing of order instantiation service 260. Order instantiation service 260 can be operable to instantiate the at least one orderable service 246, thereby generating an instantiated ordered service 262. Order instantiation service 260 includes configuration management service (CMS) 220 operable to perform the binding phase 160 and generate instantiated ordered service 262. CMS 220 includes tools and techniques for implementing binding phase 160 of the two-phase instantiation process as well the management of the model instances, e.g., model instances 130, 132 and 134. CMS 220 generates a service instance corresponding to each order.

Order fulfillment service 270 can be operable to fulfill the order in accordance with instantiated ordered service 262. Order fulfillment service 270 can include request for change (RFC) scheduling 272 and RFC execution service 274 for the sequencing of the various orders in runtime environment 120. Order fulfillment service 270 includes creation and configuration service (CCS) 230 operable to perform the grounding phase 170 of instantiated ordered service 262. CCS 230 includes tools and techniques for the implementation of grounding phase 170, which includes creation of IT artifacts (such as artifacts 140, 142, 144 and 146) in IT infrastructure 150.

The connection between runtime environment 120 and IT infrastructure 150 can be performed through actuator services 280. Actuator services 280 may include two layers, generic actuator 282 and custom actuator 284. In an embodiment, more than one generic actuators and more than one custom actuators may be included. The generic actuator 282 can be operable to dispatch instances to the custom actuator 284. For example, a server model may be configured to define deployment and provisioning information related to a Rapid Deployment Pack (RDP) deployer. A deployment request can be triggered from CCS 230 to a generic installer included in generic actuator 282, which in turn will search for a specialized deployer that can handle RDP deployment information. This technique enables a loose coupling between runtime environment 120 and IT infrastructure 150 and offers a high level of customization. That is, architecture 200 provides IT service lifecycle management tools and techniques that promote the development, capture, and subsequent reuse and refinement of reliable and scalable services. In addition, architecture 200 further provides the separation of concerns between the artifacts managed by the services be based on roles, e.g., a designer or developer (e.g., user of the design service 210) and an end user of services (e.g., user of the catalog service 240).

In a particular embodiment, architecture 200 is scalable to be deployed in applications having varying scope and complexity starting from a blade server to a large scale, enterprise-wide IT service. In an example non-depicted embodiment, SmartRack can be an example name of an application of architecture 200 that combines hardware, management software, and applications to provide customers with a unique, systematic experience to IT conceptualization, delivery, and consumption. This can be accomplished by both shipping the management software embedded with the hardware and by providing a systematic way of modeling applications that can be deployed. Once a SmartRack is powered on, the main point of user contact can be the catalog service. Service offerings can be presented to the user along with their available configuration options, each of which are characterized in terms of the resulting service's attributes, the cost, and time to build. Service offerings may be dynamically generated views based on a set of rich models, stored in the design service, that weave together the structural, functional, non functional, and runtime characteristics of a service using a set of best practices.

In a typical deployment, SmartRacks may be configured with pre-populated foundation models. Other models may be either purchased and downloaded from Hewlett Packard Development Company, L.P. (HP) or 3rd parties, or developed in house by customers. Once the appropriate service offering is selected and ordered, it can be sent to the management services that will process it and ground (materialize) it using a set of installer services. If specified in the model, once grounded, the various elements of the model are automatically monitored by monitoring service(s). SmartRacks may be deployed in stand alone mode when a customer only desires one rack of blades. In addition, through its built-in federation capability, several SmartRacks can be combined together providing a unified management experience for the customer. Lastly, SmartRack, through its open SOA architecture and service proxy technology, can support the substitution of its services by external services allowing SmartRacks to reuse existing management software assets of the enterprise, and, allow more than one SmartRacks to be combined so that they are both managed through one user interface (instead of each being independent).

In an example non-depicted embodiment, architecture 200 can be a scaled up to a full enterprise architecture that puts services as the key economic principle of value transfer between business (or enterprise) and IT. IT may provide "IT-consumed services" to operate itself (tools and techniques to improve internal productivity). These are things like service desk technologies, change management systems, blades, facility services, networks, employees, legal services. These services can be thought of as the tooling of IT, and together they can be used to create the IT deliverable, the "IT-delivered service." IT-delivered services can be created by IT for use by the business.

Examples might include a consumer credit check service, employee expense reporting service, new employee set up service, a QA lab rental service, a private network and similar others. The IT delivered services can be delivered as an economic unit of value to the business. In other words, they are designed, constructed and delivered in a way such that the lines of business see its value, and are willing and able to purchase them. In fact, the IT-delivered service transforms into to a business-consumed service at the moment of payment. This payment can be indicative of the value as perceived the consumer, which in this case is the line of business. The IT-delivered services in and of themselves render IT as a service provider.

IT services provided to a business may be defined starting with a name (e.g. sales forecasting service), followed by a description (e.g. daily worldwide sales pipeline report and analysis for senior sales management). Every service may need additional artifacts and descriptors that are associated with the ongoing integrity of the service. These may include the service level agreements (SLAs) so that IT and the business are aligned around performance and availability, a logical and physical view of the configuration items that underpin the service, a view or dependant services, documentation, a continuity plan, knowledge entries, subscriber entitlements, and security and access provisions. The IT services may be defined by defining a service-line category structure. Just like consumer goods providers have product line categories, so do IT services. They may include employee services, application services, network services, others.

Similar to consumer products, IT services may be established with a price, value and business outcome for each service. In order to qualify as an IT-delivered service, it is desirable that there is an associated, measurable business outcome. The IT services can be made available through a customer catalog service by developing a consistent way to articulate both a public (business-facing) and private (IT-facing) characterization of each service. Service components can be reused whenever possible. Consistent design criteria for both the public and private facing characterization of the service can directly impact the process automation effort required to instantiate, monitor and manage the service throughout its lifecycle. Service visibility and integrity can be maintained at all levels including management stakeholders like the service desk, problem managers, change managers, application owners, IT finance managers, business relationship managers are able to view and manage activities around the service definition in a consistent way. When scaling up to the enterprise-wide architecture, IT provided services are defined as models and the services of the runtime environment are the embodiments of the IT consumed services.

Example Services Supported by Architecture 200

FIGS. 3A, 3B, and 3C illustrate in a tabular form an example list of service operations supported by architecture 200 described with reference to FIGS. 2A and 2B, according to an embodiment. In accordance with the principles of SOA, components in architecture 200 are conceived as model services, that is, independent units of functionality with well specified interfaces and data models. The list of model services may be described to perform a generic service (for aggregating data across data services), a data service (for the management of lifecycle of specific data models), a computational service (for the execution of business logic) or a combination thereof. Activation service 302 can be a generic actuator with responsibility to dispatch service activation requests to an appropriate custom activator. Approval service 304 (computational service) can be responsible for approving or not approving a received order. Authentication service 306 (data and computational service) can be responsible for the management of users, roles and access rights as well as granting authorizations. Billing service 308 (computational service) can be responsible for setting up charge back mechanism and proper billing for received orders.

Catalog service 312 (computational service) can be responsible for the generation of a service offerings. Configuration management service 314 (data service) can be responsible for carrying out a binding phase of the instantiation process and for the management of the lifecycle of instances. Creation configuration service 316 (data service) can be responsible for carrying out a grounding phase of the instantiation process. Design service 318 (data service) can be responsible for the management of the lifecycle of models.

Discovery service 322 (computational service) can be a generic actuator responsible for triggering the discovery of assets in the infrastructure. To fulfill its responsibility, discovery service 322 can connect to custom discovery services. Incident service 324 (data service) can be responsible for the management of the lifecycle of incidents or events. Installer service 326 can be a generic actuator responsible to dispatch service installation requests to the appropriate custom activator. Logging service 328 (data service) can be responsible for the lifecycle management of log messages.

Monitoring service 332 can be a generic actuator that has the responsibility to dispatch service monitoring requests to the appropriate custom activator. Offering availability estimation service 334 (computational service) can be responsible for the generation of service offering availability and pricing. Order processing service 336 (data service) can be responsible for the management of the lifecycle of orders. Package model design service 338 (data service) can be responsible for the lifecycle management of a package model.

Policy service 342 (data and computational service) can be a generic service and has the responsibility of dispatching policy evaluation requests to the appropriate specific policy services. Request resolution service 344 (computational service) can be responsible for initiation of the instantiation process of service models. Request for change (RFC) execution service 346 (data service) can be responsible for the management of the lifecycle of RFCs in the platform. RFC scheduling service 348 (computational service) can be responsible for finding optimal schedules for RFC in the platform.

Session service 352 (data service) can be responsible for the management of the lifecycle of sessions. The create method generates a new session in the open state associated with a new, unique SessionKey. Changes to the session state, such as closing the session can be done through the update method. Validation service 354 (computational service) can be responsible for the validation of an order.

Change catalog service 356 can be responsible for the management of changes to the catalog, such as changes due to new features, software updates, hardware availability, etc. Consumer management service 358 can be responsible for providing an interface for consumers and manages retrieving service offerings, ordering services, retrieving changes, making order changes, establishing logins, and the like. Provider management service 360 can be responsible for providing an interface for providers, thus allowing management of users and profiles, designs, designs supported, pricing, and the like. In various embodiments, consumer management service 358 and/or provider management service 360 coordinates with session service 352 to provide an interface for users.

Figure 4:
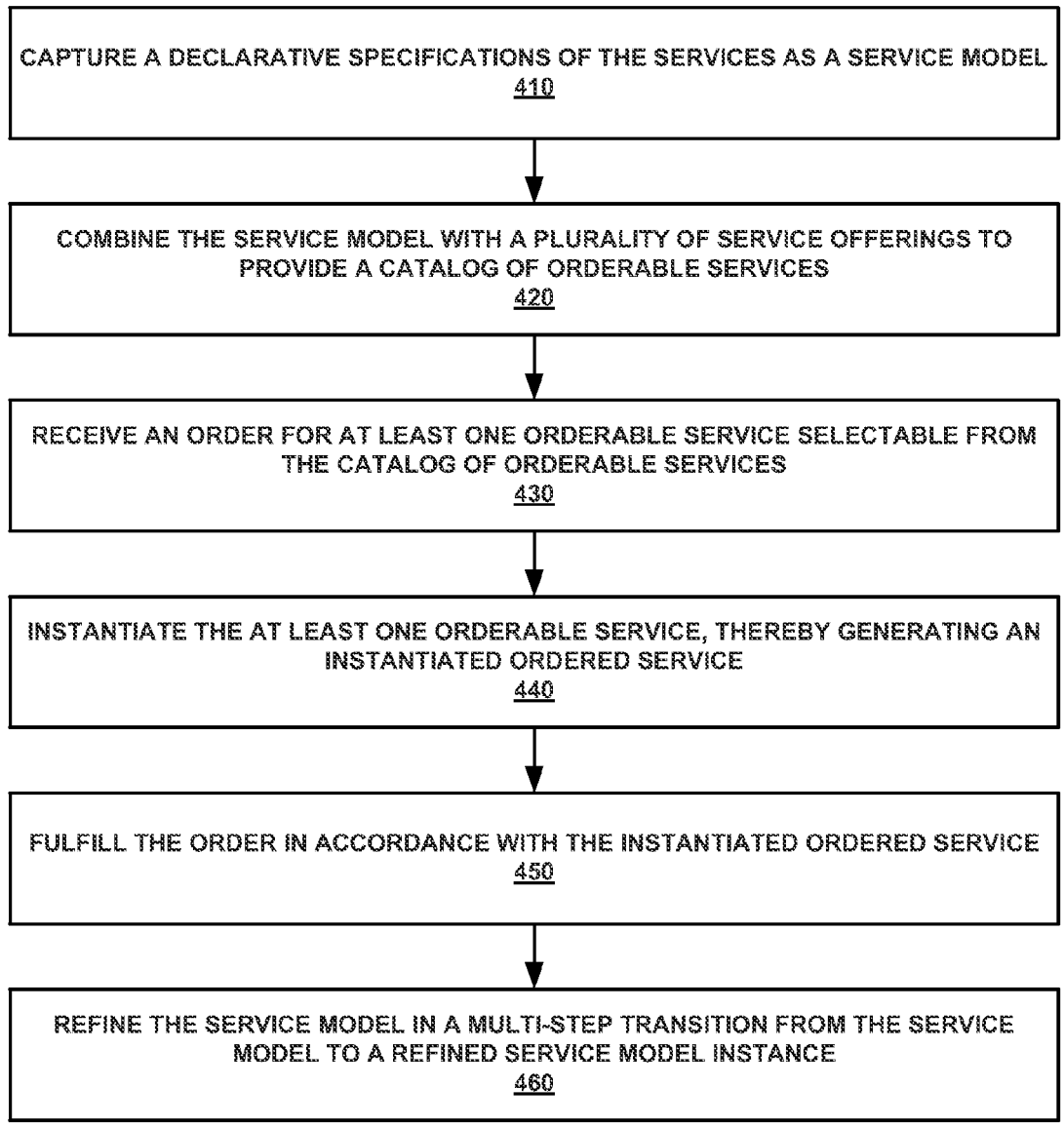
FIG. 4 is a flow chart of an example method for managing IT services, according to an embodiment.

FIG. 4 is a flow chart of an example method for managing IT services, according to an embodiment. In a particular embodiment, the method may be used to manage model 100 described with reference to FIGS. 1A and 1B. In an embodiment, method 100 may be used to manage IT services provided by architecture 200 deployable in an e-commerce environment. Referring now to 410 of FIG. 4, declarative specifications of the services are captured as a service models. Referring now to 420 of FIG. 4, the service models can be combined into a plurality of service offerings to provide a catalog of orderable services. At step 430, an order can be received for at least one orderable service selectable from the catalog of orderable services. Referring now to 440 of FIG. 4, the at least one orderable service can be instantiated, thereby generating an instantiated ordered service. Referring now to 450 of FIG. 4, the order can be fulfilled in accordance with the instantiated ordered service.

It is understood, that various steps described above may be added, omitted, combined, altered, or performed in different orders. For example, a method may be added to refine the service models. Referring now to 460 of FIG. 4, the service models can be refined, the refining including a multi-step transition from the service models to a refined service model.

Example Service Model Refiner

Figure 5:
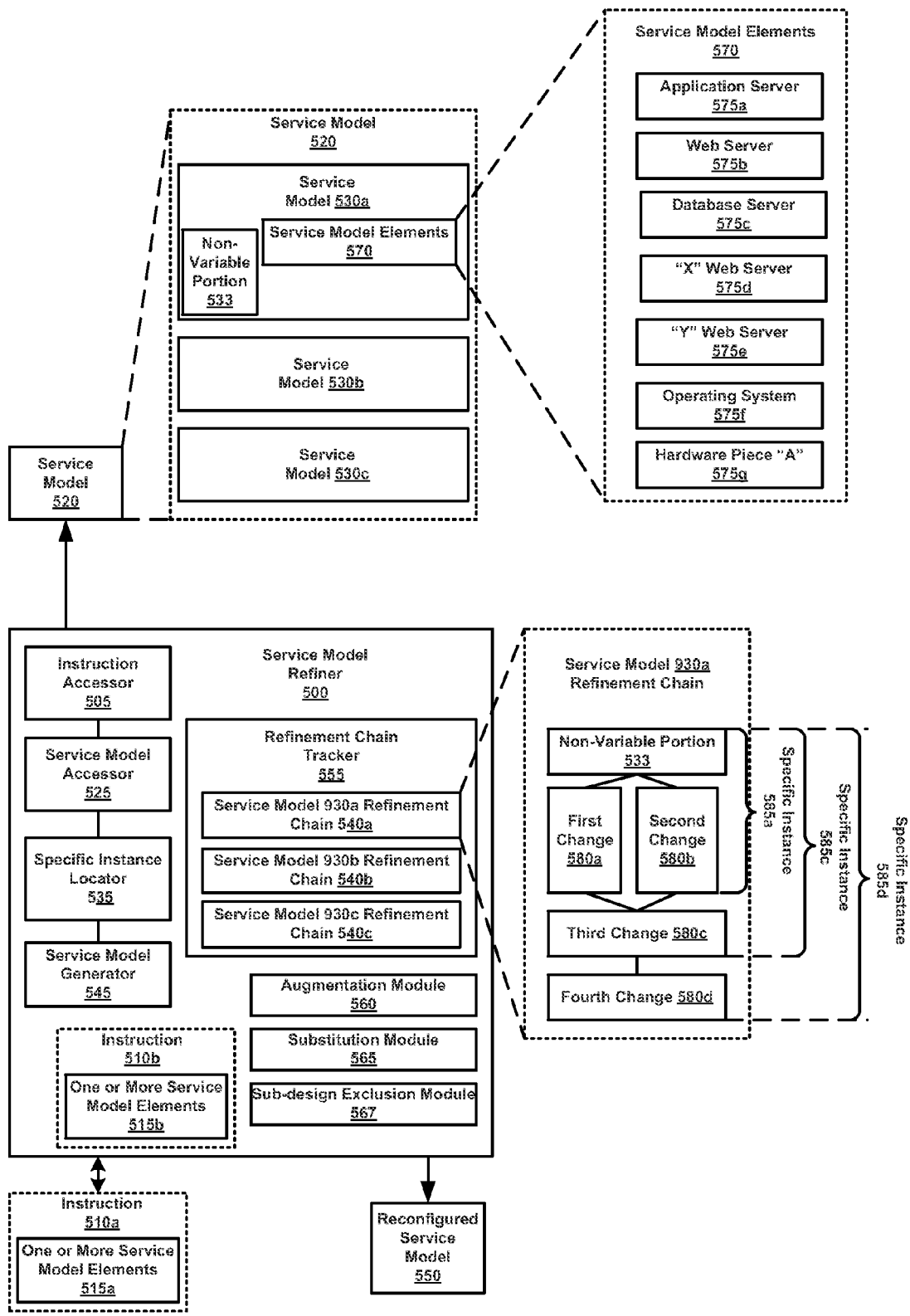
FIG. 5 illustrates a block diagram of an example model refiner, according to an embodiment.

With reference to FIG. 5, embodiments in accordance with the present invention pertain to an example system for reconfiguring a service model. In one embodiment, service model refiner (SMR 500) described herein enables ongoing reconfiguration of a service model and portions thereof according to a consumer's instruction, a system operator's instruction, and/or preprogrammed instructions.

In general, SMR 500 enables the reconfiguration of a service model by utilizing a refinement chain to break down a service model into specific instances, and then strategically applying operations (e.g., augmentation, substitution, and sub-design exclusion) to a compatible specific instance. SMR 500 then utilizes the refinement chain as a guide to rebuild the service model, incorporating any modifications. Thus, embodiments of the present invention enable the continuous reversible generation and tracking of a reconfigured service model.

More particularly, in one embodiment a service model may further comprise a plurality of tiered service models. For example, a service model may comprise a gold, silver, and bronze service model. Each one of these service models has predetermined constraints. For example, the gold service model constraints allow for one load balancer and between five and ten web server nodes, while the silver service model constraints allow for one load balancer and a maximum of four web server nodes. The bronze service model constraints only allow for a maximum of three web server nodes. These service models may be reconfigured according to a user's instruction and any constraints placed thereon.

In one embodiment, a user may provide SMR 500 with an instruction to add service model elements, such as three web server nodes, to the gold service model that may already have seven web server nodes. SMR 500 then utilizes a refinement chain to access a non-variable portion of the gold service model, wherein the non-variable portion comprises only the service model elements that define the gold service model's original constraints, that of one load balancer and between five and ten web server nodes. The term "non-variable" refers to a fixed number of items. However, this fixed number of items, itself, may include a portion that is variable. Thus, there is a recursive element to embodiments of the present invention within the non-variable portions. In one embodiment, the refinement chain functions to track all design changes associated with the gold service model.

Next, SMR 500 determines the location, referred to as the specific instance, along the refinement chain closest to the non-variable portion at which the inclusion of the three web server nodes alters the performance of the gold service model to reflect the inclusion of the desired three properly functioning web server nodes. SMR 500 then begins to rebuild the gold service model by first adding the three web server nodes at the located specific instance. Using the refinement chain as a guide, SMR 500 continues to rebuild the rest of the gold service model to obtain a reconfigured service model according to the user's instructions.

Of significance, SMR 500 depends upon at least the following three operations that enable reconfiguration of a service model: augmentation, substitution, and sub-design exclusion. Augmentation of a service model enables the addition of a service model element to a service model. Substitution refers to the substitution of requested service model elements with service model elements comprising the service model. Sub-design exclusion utilizes service model elements to disable a particular service model.

Thus, in embodiments of the present invention, SMR 500 utilizes the principle operations of augmentation, substitution, and sub-design exclusion to enable on-going, reversible, and traceable re-configurations of a service model. On a larger scale, SMR 500 enables the integration and aggregation of a plurality of reconfigured service models.

The following discussion will begin with a description of embodiments of the structure of components herein in accordance with the present technology. This discussion will then be followed by a description of embodiments of the operation and function of the components herein.

Example Architecture of Model Refiner

FIG. 5 illustrates a block diagram of an example service model refiner (SMR) 500, in accordance with embodiments of the present invention. While embodiments of the present technology are discussed as taking the form of a model refiner as applied to "service"s, it is understood that the model refiner described herein may be applied more generally to any type of model refiner, declarative or otherwise.

SMR 500 comprises instruction accessor 505, service model accessor 525, specific instance locator 535, service model generator 545, a refinement chain tracker 555 comprising refinement chains 540a, 540b, and 540c for service models 530a, 530b, and 530c respectively, augmentation module 560, substitution module 565, and sub-design exclusion module 567. SMR 500 is coupled with service model 520.

In one embodiment, service model 520 comprises one or more service models, tiered and/or non-tiered. For example, service model 520 may be a three-tiered service model integrating service model 530a, service model 530b, and service model 530c. Of note, SMR 500 is well suited to any number of service models comprising service model 520. While reference herein to a service model addresses service model 530a, 530b, and/or 530c, it should be appreciated that in another embodiment, reference to a service model may address service model 520 comprising service models 530a, 530b, and/or 530c.

Furthermore, each service model 530a, 530b, and 530c comprises service model elements. For example, service model 530a comprises service model elements 570. Of note, SMR 500 is well suited to any number of service model elements comprising each service model 530a, 530b, and/or 530c.

A service model element is that which comprises a service model, the inclusion or exclusion of which affects the functionality of the service model, and may be, but is not limited to, an attribute, a variable, an import, and a cardinality of association. For example, service model elements 570 of service model 530a comprise application server 575a, web server 575b, database server 575c, "X" web server 575d, "Y" web server 575e, operating system 575f, and hardware piece "A" 575g.

In one embodiment, every service model comprises a non-variable portion. This non-variable portion includes the constraints originally imposed upon the service model, which apply to both variable and non-variable portions. These constraints may be imposed by, but not limited to, a user, a system operator, and/or an already preprogrammed instruction within SMR 500. For example, service model 530a may include non-variable portion 533. Non-variable portion 533 includes the constraints originally imposed upon the service model 530a, which apply to both variable and non-variable portions. In this example, these original constraints comprising non-variable portion 533 are application server 575a, web server 575b, and database server 575c.

Service model 530a refinement chain 540a comprises non-variable portion 533, first change 580a, second change 580b, third change 580c, and fourth change 580d. While non-variable portion 533 comprises application server 575a, web server 575b, and database server 575c, first change 580a comprises "X" web server 575d coupled with non-variable portion 533. Each change, in combination with all changes occurring before it and all changes made at the same level, defines a specific instance. Thus, first change 580a and non-variable portion 533 comprise specific instance 585a.

In another example, second change 580b comprises "Y" web server 575e coupled with non-variable portion 533. Thus first change 580a, second change 580b, and non-variable portion 533 comprise specific instance 585a. In another embodiment, third change 580c comprising operating system 575f coupled with non-variable portion 533 defines specific instance 585c. In another embodiment, fourth change 580d comprising hardware piece "A" 575g coupled with operating system 575f and non-variable portion 533 defines specific instance 585d.

For example, the coupling of an "X" web server 575d and original constraints, non-variable portion 533, imposed by a manufacturer, creates specific instance 585a, according to service model 530a refinement chain. In other words, specific instance 585a comprises the combination of non-variable portion 533 (application server 575a, web server 575b, and database server 575c) and first change 580a (adding "X" web server 575d).

Of note, SMR 500 may access and utilize a refinement chain associated with a service model that is maintained by a system other than SMR 500 and is external to SMR 500.

In one embodiment, SMR 500 may receive an instruction 510a from, but not limited to, a user, an operator, or an internally based instruction 510b. Instructions 510a and 510b comprise one or more service model elements 515a and 515b respectively.

Example Operation of Service Model Refiner

More generally, in embodiments in accordance with the present invention, SMR 500 is used to reconfigure a service model in accordance with instructions from a user, programmer, and/or internally based instructions. These instructions may request that the service model be altered to account for more service model elements, substitute existing service model elements for desired service model elements, or exclude a service model element.

More particularly, and referring to FIG. 5, in one embodiment, instruction accessor 505 accesses instruction 510a, wherein instruction 510a comprises utilizing one or more service model elements 515a to reconfigure service model 520.

In one embodiment, service model accessor 525 utilizes service model 530a refinement chain 540a, to access non-variable portion 533 of service model 530a that is associated with instruction 510a, and wherein service model 530a refinement chain 540a tracks design changes for service model 530a. For example, SMR 500 accesses instruction 510a requesting an augmentation to gold service model 530a of service model 520. SMR 500 then accesses the service model that is associated with instruction 510a, that of gold service model 530a, in order to satisfy the instruction.

SMR 500 then utilizes service model 530a refinement chain 540a to locate non-variable portion 533 of gold service model 530a. SMR 500 tracks backwards from the latest change, fourth change 580d, to the portion of service model 530a refinement chain 540a that only includes the original constraints (server 575a, web server 575b, and database server 575c).

In one embodiment, specific instance locator 535 locates specific instance 585a that is closest to non-variable portion 533 within service model 530a refinement chain 540a at which an inclusion of one or more service model elements 515a alters a performance of service model 530a to reflect the inclusion. For example, specific instance locator 535 locates the specific instance closest to non-variable portion 533 at which the addition of user's request of "X" web server 575d alters the performance of service model 530a to reflect the existence of properly functioning "X" web server 575d.

Of note, an imported service model element may be reconfigured by any subtype of an imported service model element type. For example, imported web server 575b may be reconfigured by imported web server subtypes "X" web server and "Y" web server.

In one embodiment, service model generator 545 re-instantiates service model 530a utilizing the instructed one or more service model elements 515a beginning at specific instance 585b, thereby enabling a generation of reconfigured service model 550 according to instruction 510a. For example, beginning at specific instance 585b, SMR 500 re-instantiates service model 530a to include "X" web server. SMR 500 continues to re-instantiate service model 530a by utilizing service model 530a refinement chain as a guide to strategically reconstruct service model 530a that was deconstructed.

As described herein, refinement chain tracker 555 tracks design changes for service model 530a.

In one embodiment, augmentation module 560 increases a sum total of all service model elements 570 comprising service model 530a by adding one or more service model elements 515a comprising instruction 510a to service model 530a.

In another embodiment, substitution module 565 substitutes one or more service model elements 515a comprising instruction 510a with one or more service model elements 570 of service model 530a. For example, a refinement chain for service model 530a may be represented as an abstract class B with a dependency of a range [1, 4]. [1, 4] has a refinement of {3, 4}. {3, 4} has a refinement of 3 web server nodes. Service model 530a is found to be successful, and it is desired to scale service model 530a upwards so that more people can use it.

Therefore, in one embodiment, the system operator may substitute the value of 3 web server nodes with the value of 4 web server nodes. This is a valid substitution since it validates the space of values constrained by the enumeration, {3, 4}. As a result of the substitution, the refinement chain for service model 530a is represented as an abstract class B with a refinement of a range of [1, 4]. [1, 4] has a refinement of {3, 4}. {3, 4} has a refinement of 4 web server nodes.

If it is found that 4 web server nodes are not enough to accommodate so large a number of people using service model 530a, then SMR 500 may return to the first dependency occurring after the original constraints (non-variable portion) and increase the range of [1, 4] to the range of [1, 10]. The new refinement chain for service model 530a is represented as an abstract class B with a dependency of range [1, 10]. Without further modification, the refinement chain would show [1, 10] having a refinement of {3, 4}, and {3, 4} having a refinement of 4 web server nodes. Of note, this refinement chain validates the constraints propagation since 4 is constrained by the enumeration {3, 4}.

Now, in order to increase the number of web server nodes available for users, service model generator 545 re-instantiates the service model beginning at the specific instance [1, 10] of the refinement chain. After re-instantiation, the refinement chain is represented as an abstract class B with a dependency of range [1, 10]. According to an instruction to modify upwards the number of web server nodes to 8, [1, 10] has a refinement of 8 web server nodes.

In one embodiment, sub-design exclusion module 567 utilizes one or more conditional statements to exclude a service model element of a group of one or more service model elements 570 comprising service model 530a. In one embodiment, conditional statements may be cardinality expressions. In another embodiment, conditional statements may be variability expressions.

For example, the cardinality attribute of "End" in "AssociationEnd" may be expressed as a conditional statement that resolves to zero under a certain condition. In other words, the target item associated with the assigned zero is not wanted. For example, if the target item that is not wanted is the bronze service of the aggregated service model 520, then a zero may be assigned to the cardinality in the association that refers to the bronze service model portion. Hence, the bronze service portion is disabled when gold variability is selected.

In one embodiment, SMR 500 may be triggered to revert to non-variable portion 533 in order to prepare for re-instantiating when a preprogrammed performance threshold has not been met by one or more service model elements within service model 530a. In another embodiment, SMR 500 may be triggered to revert to non-variable portion 533 via a manual triggering instruction to reconfigure.

The manual triggering instruction to reconfigure may be performed by, but not limited to, a user in one instance, and by the operator in another instance. For example, a user may decide to downgrade a service. Perhaps the user does not think that the service is worth the price demanded. The user downgrades from a gold service model to a silver or bronze service model. As shown, a user may terminate a service via SMR 500.

In another embodiment, a system operator may need to move a running service from one machine to another machine because of machine maintenance issues. As a result, the system operator instructs SMR 500 to reconfigure a service model.

FIG. 6 is a flowchart of an example method 600 of reconfiguring service model 520. With reference now to 605 of FIG. 6, instruction 510a is accessed, wherein instruction 510a comprises utilizing one or more service model elements 515a to reconfigure service model 530a.

With reference to 610 of FIG. 6, a refinement chain is utilized to access a portion of service model 530a, the portion being non-variable 533 and associated with instruction 510a, and wherein the refinement chain tracks design changes for service model 530a.

With reference to 615 of FIG. 6, a specific instance is located that is closest to the portion within the refinement chain at which an inclusion of the one or more service model elements 515a alters a performance of the service model 530a to reflect the inclusion With reference to 620 of FIG. 6, one or more service model elements 515a are utilized to re-instantiate portion 530a beginning at a specific instance, thereby enabling a generation of reconfigured service model 550 according to instruction 510a.

In one embodiment, re-instantiating 620 portion 530a comprises increasing a sum total of all service model elements 570 comprising service model 530a by adding one or more service model elements 515a comprising instruction 510a to service model 530a. In one embodiment, re-instantiating 620 portion 530a comprises substituting one or more service model elements 515a comprising instruction 510a with one or more service model elements 570 comprising service model 530a.

In one embodiment, re-instantiating 620 service model 530a comprises utilizing a conditional statement as one or more service model elements 515a. In one embodiment, this conditional statement is utilized to exclude a service model element 572c of a group of one or more service model elements 570 of service model 530a. In another embodiment, the conditional statement utilized is one or more cardinality expressions.

In one embodiment, method 600 further comprises aggregating a plurality of reconfigured service models 550. In one embodiment, method 600 further comprises verifying that one or more original constraints for portion 530a are satisfied.

Example Computer System Environment

Figure 7:
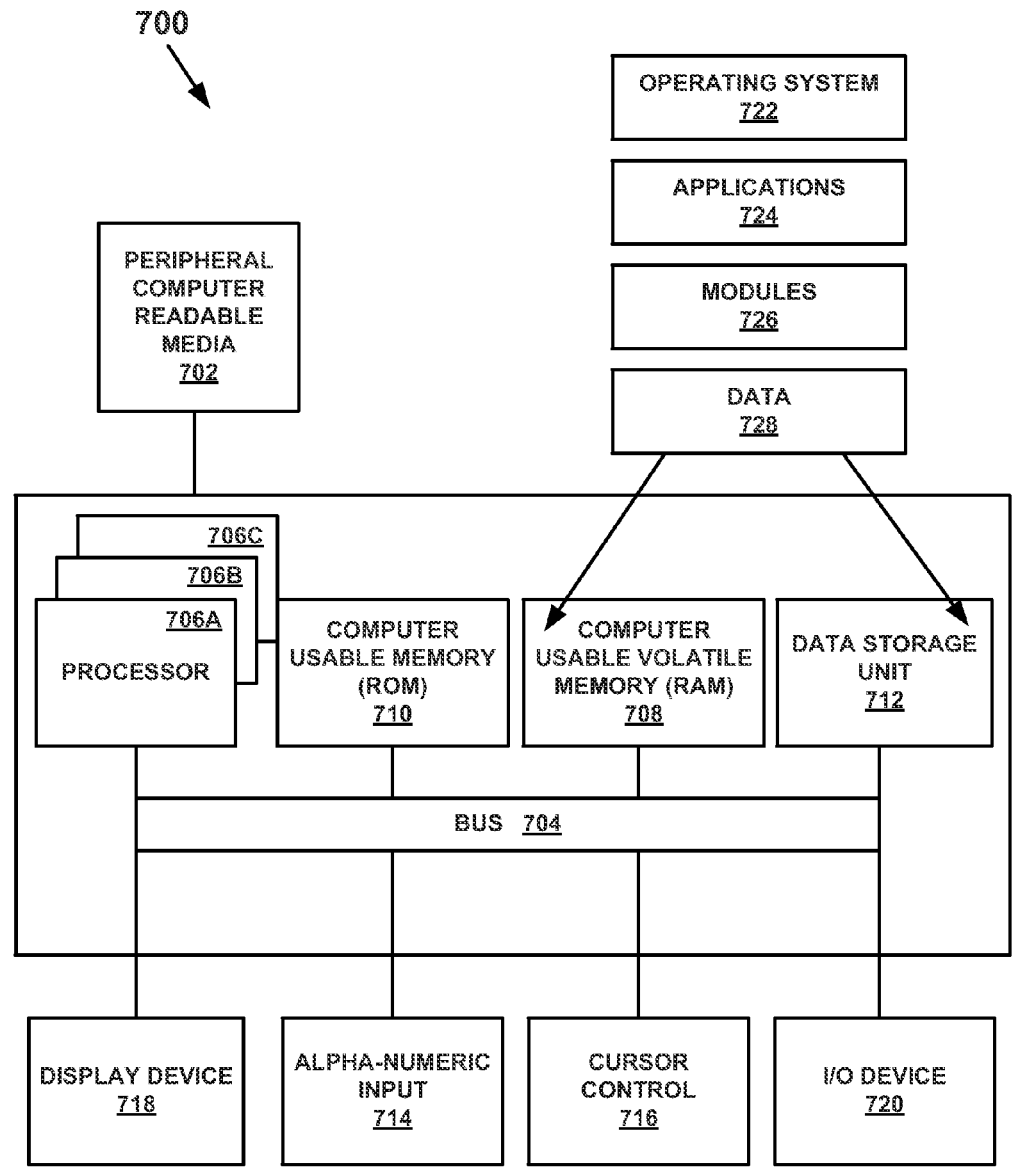
FIG. 7 is a diagram of an example computer system used for reconfiguring a model, according to an embodiment.

With reference now to FIG. 7, portions of embodiments of the present invention for reconfiguring a service model are composed of computer-readable and computer-executable instructions that reside, for example, in computer-usable media of a computer system. That is, FIG. 7 illustrates one example of a type of computer that can be used to implement embodiments, which are discussed below, of the present invention.

FIG. 7 illustrates an example computer system 700 used in accordance with embodiments of the present invention. It is appreciated that system 700 of FIG. 7 is an example only and that embodiments of the present invention can operate on or within a number of different computer systems including general purpose networked computer systems, embedded computer systems, routers, switches, server devices, user devices, various intermediate devices/artifacts, stand alone computer systems, and the like. As shown in FIG. 7, computer system 700 of FIG. 7 is well adapted to having peripheral computer readable media 702 such as, for example, a floppy disk, a compact disc, and the like coupled thereto.

System 700 of FIG. 7 includes an address/data bus 704 for communicating information, and a processor 706A coupled to bus 704 for processing information and instructions. As depicted in FIG. 7, system 700 is also well suited to a multi-processor environment in which a plurality of processors 706A, 706B, and 706C are present. Conversely, system 700 is also well suited to having a single processor such as, for example, processor 706A. Processors 706A, 706B, and 706C may be any of various types of microprocessors. System 700 also includes data storage features such as a computer usable volatile memory 708, e.g. random access memory (RAM), coupled to bus 704 for storing information and instructions for processors 706A, 706B, and 706C.

System 700 also includes computer usable non-volatile memory 710, e.g. read only memory (ROM), coupled to bus 704 for storing static information and instructions for processors 706A, 706B, and 706C. Also present in system 700 is a data storage unit 712 (e.g., a magnetic or optical disk and disk drive) coupled to bus 704 for storing information and instructions. System 700 also includes an optional alpha-numeric input device 714 including alphanumeric and function keys coupled to bus 704 for communicating information and command selections to processor 706A or processors 706A, 706B, and 706C. System 700 also includes an optional cursor control device 716 coupled to bus 704 for communicating user input information and command selections to processor 706A or processors 706A, 706B, and 706C. System 700 of embodiments of the present invention also includes an optional display device 718 coupled to bus 704 for displaying information.

Referring still to FIG. 7, optional display device 718 of FIG. 7 may be a liquid crystal device, cathode ray tube, plasma display device or other display device suitable for creating graphic images and alpha-numeric characters recognizable to a user. Optional cursor control device 716 allows the computer user to dynamically signal the movement of a visible symbol (cursor) on a display screen of display device 718. Many implementations of cursor control device 716 are known in the art including a trackball, mouse, touch pad, joystick or special keys on alpha-numeric input device 714 capable of signaling movement of a given direction or manner of displacement. Alternatively, it will be appreciated that a cursor can be directed and/or activated via input from alpha-numeric input device 714 using special keys and key sequence commands.

System 700 is also well suited to having a cursor directed by other means such as, for example, voice commands. System 700 also includes an I/O device 720 for coupling system 700 with external entities.

Referring still to FIG. 7, various other components are depicted for system 700. Specifically, when present, an operating system 722, applications 724, modules 726, and data 728 are shown as typically residing in one or some combination of computer usable volatile memory 708, e.g. random access memory (RAM), and data storage unit 712. However, it is appreciated that in some embodiments, operating system 722 may be stored in other locations such as on a network or on a flash drive; and that further, operating system 722 may be accessed from a remote location via, for example, a coupling to the internet. In one embodiment, the present invention, for example, is stored as an application 724 or module 726 in memory locations within RAM 708 and memory areas within data storage unit 712.

Computing system 700 is only one example of a suitable computing environment and is not intended to suggest any limitation as to the scope of use or functionality of the present invention. Neither should the computing environment 700 be interpreted as having any dependency or requirement relating to any one or combination of components illustrated in the example computing system 700.

Embodiments of the present invention may be described in the general context of computer-executable instructions, such as program modules, being executed by a computer. Generally, program modules include routines, programs, objects, components, data structures, etc., that perform particular tasks or implement particular abstract data types. Embodiments of the present invention may also be practiced in distributed computing environments where tasks are performed by remote processing devices that are linked through a communications network. In a distributed computing environment, program modules may be located in both local and remote computer-storage media including memory-storage devices.

FIG. 8 is a flowchart of an example method 800 for reconfiguring service model 530*a*. In one embodiment, method 800 is carried out by processors and electrical components under the control of computer readable and computer executable instructions. The computer readable and computer executable instructions reside, for example, in data storage features such as computer usable volatile and non-volatile memory. However, the computer readable and computer executable instructions may reside in any type of computer readable medium. In one embodiment, method 800 is performed by service model refiner 500 of FIG. 5.

With reference now to 805 of FIG. 8, non-variable portion 530*a* of service model 530*a* that is a target of instruction 510*a* is accessed. Instruction 510*a* comprises altering service model 530*a* utilizing one or more service model elements 515*a*.

With reference to 810 of FIG. 8, in one embodiment the refinement chain associated with non-variable portion 533 is accessed. Service model 530*a* refinement chain 540*a* tracks design changes for service model 530*a*.

With reference to 815 of FIG. 8, in one embodiment service model 530*a* refinement chain 540*a* and instruction 515*a* is compared and specific instance 580*b* at which an inclusion of one or more service model elements 515*a* alters a performance of specific instance 580*b* to reflect the inclusion is located.

With reference to 820 of FIG. 8, in one embodiment, based on the comparing and locating at 815, a re-instantiated service model is generated 550 to correlate with instruction 515*a*.

Thus, embodiments of the present invention enable the generation of reconfigured service models that may be ongoing, reversible, and traceable. Furthermore, on a larger scale, in one embodiment SMR 500 enables the integration and aggregation of a plurality of reconfigured service models.

The foregoing descriptions of example embodiments have been presented for purposes of illustration and description. They are not intended to be exhaustive or to limit the teaching to the precise forms disclosed. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer implemented method for reconfiguring a service model, said method comprising:

accessing an instruction, wherein said instruction comprises utilizing one or more service model elements to reconfigure a service model, wherein an inclusion or exclusion of said one or more service model elements affects a functionality of said service model;

utilizing a refinement chain to break down said service model into specific service instances and access a portion of said service model associated with said instruction, wherein said portion includes a non-variable portion, wherein said non-variable portion comprises constraints that were originally imposed upon said service model, and wherein said refinement chain tracks design changes for said service model;

locating a specific instance of a set of specific instances that includes changes made to said service model, wherein said changes made occurred at a location closest to said non-variable portion within said refinement chain, at which said location an inclusion or exclusion of said one or more service model elements alters a performance of said service model to reflect said inclusion or said exclusion, wherein each specific instance of said set of specific instances comprises: said non-variable portion; and each change made in combination with changes occurring before said each change was made along with changes made at a same level as said each change was made; and re-instantiating said service model, beginning at said specific instance, utilizing said refinement chain and said one or more service model elements to incorporate modifications, thereby enabling a re-configuration of said service model according to said instruction.

2. The method of claim 1, wherein said re-instantiating said service model comprises:
increasing a sum total of all service model elements comprising said service model by adding said one or more service model elements comprising said instruction to said service model.

3. The method of claim 1, wherein said re-instantiating said service model comprises:
substituting said one or more service model elements comprising said instruction with one or more service model elements comprising said service model.

4. The method of claim 1, wherein said re-instantiating said service model comprises:
utilizing a conditional statement as said one or more service model elements.

5. The method of claim 4, further comprising:
utilizing said conditional statement to exclude a service model element of a group of one or more service model elements of said service model.

6. The method of claim 5, wherein said conditional statement is one or more cardinality expressions.

7. The method of claim 1, further comprising:
aggregating a plurality of reconfigured models.

8. The method of claim 1, further comprising:
verifying that one or more original constraints for said service model are satisfied.

9. A computer program product for reconfiguring a service model comprising:
logic instructions stored on a computer readable storage media, the logic instructions being executable by a computer processor to cause the computer processor to perform a method for reconfiguring a service model, said method comprising:
accessing a non-variable portion of a service model that is a target of an instruction, said instruction comprising altering said service model utilizing one or more service model elements, wherein an inclusion or exclusion of said one or more service model elements affects a functionality of said service model;
accessing a refinement chain associated with said service model, said refinement chain configured for breaking down said service model into specific service model instances and for tracking design changes for said service model, wherein said non-variable portion comprises constraints that were originally imposed upon said service model;
comparing said refinement chain to said instruction and locating a specific instance of a set of specific instances that includes changes made to said service model, wherein said changes were made to said service model, wherein said changes made occurred at a location closest to said non-variable portion within said refinement chain, at which said location an inclusion or exclusion of said one or more service model elements alters a performance of said service model to reflect said inclusion or said exclusion, wherein each specific instance of said set of specific instances comprises: said non-variable portion; and each change made in combination with changes occurring before said each change was made along with changes made at a same level as said each change was made; and based on said comparing and said locating, generating a re-instantiated model to correlate with said instruction, wherein said generating comprises, beginning at said specific instance, utilizing said refinement change and said one or more service model elements to incorporate modifications.

10. The method of claim 8, further comprising:
aggregating a plurality of reconfigured service models.

11. A model refiner for reconfiguring a service model, said model refiner comprising:
an instruction accessor configured for accessing an instruction, wherein said instruction comprises utilizing one or more service model elements [515a] to reconfigure said service model, wherein an inclusion or exclusion of said one or more service model elements affects a functionality of said service model;
a model accessor configured for utilizing a refinement chain to break down said service model into specific service instances, wherein said model accessor accesses a portion of said service model that is associated with said instruction, wherein said portion of said service model includes a non-variable portion, wherein said non-variable portion comprises constraints that were originally imposed upon said service model, and wherein said refinement chain tracks design changes for said service model;
a specific instance locator configured for locating a specific instance of a set of specific instances that includes changes made to said service model, wherein said changes made occurred at a location closest to said non-variable portion within said refinement chain, at which said location an inclusion or exclusion of said one or more service model elements alters a performance of said service model to reflect said inclusion or said exclusion, wherein each specific instance of said set of specific instances comprises: said non-variable portion; and each change made in combination with changes occurring before said each change was made along with changes made at a same level as said each change was made; and
a model generator configured for re-instantiating said service model utilizing said refinement chain and said one or more service model elements to incorporate modifications, thereby enabling a reconfiguration of said service model according to said instruction.

12. The model refiner of claim 11, further comprising:
a refinement chain tracker configured for tracking design changes for said service model.

13. The model refiner of claim 11, further comprising:
an augmentation module configured for increasing a sum total of all service model elements comprising said service model by adding said one or more service model elements comprising said instruction to said service model.

14. The model refiner of claim 11, further comprising:
a substitution module configured for substituting said one or more service model elements comprising said instruction with one or more service model elements of said service model.

15. The model refiner of claim 11, further comprising:
a sub-design exclusion module configured for utilizing one or more conditional statements to exclude a service model element of a group of one or more service model elements comprising said service model.

* * * * *